United States Patent [19]
Davies et al.

[11] Patent Number: 5,818,098
[45] Date of Patent: Oct. 6, 1998

[54] SEMICONDUCTOR DEVICE HAVING A PEDESTAL

[75] Inventors: Robert B. Davies, Tempe; Andreas A. Wild, Scottsdale; Diann M. Dow, Chandler; Peter J. Zdebel, Mesa; E. James Prendergast, Phoenix, all of Ariz.

[73] Assignee: Motorola, Inc., Schaumburg, Ill.

[21] Appl. No.: 608,864

[22] Filed: Feb. 29, 1996

[51] Int. Cl.[6] ................................................. H01L 23/58
[52] U.S. Cl. .......................... 257/506; 257/510; 257/377
[58] Field of Search .................................. 257/344, 376, 257/408, 506, 510, 524

[56] References Cited

U.S. PATENT DOCUMENTS

| | | | |
|---|---|---|---|
| 4,198,252 | 4/1980 | Hsu | 438/287 |
| 4,371,955 | 2/1983 | Sasaki | 365/185 |
| 4,697,198 | 9/1987 | Komori et al. | 257/344 |
| 5,021,845 | 6/1991 | Hashimoto | 257/330 |
| 5,395,773 | 3/1995 | Ravindhran et al. | 438/217 |
| 5,434,093 | 7/1995 | Chau et al. | 438/300 |
| 5,548,154 | 8/1996 | Miller | 257/506 |
| 5,600,168 | 2/1997 | Lee | 257/344 |

OTHER PUBLICATIONS

H. Lin et al., "Computer Analysis of the Double–Diffused MOS Transistor for Integrated Circuits," Transactions on Electron Devices, vol. Ed–20, No. 3, Mar. 1973, pp. 275–282.

S. Shimizu et al., "0.15 μm CMOS Process for High Performance and High Reliability,"IEEE 1994, San Francisco, CA, pp. 67–70.

K. Lee et al., "Room Temperature 0.1 μm CMOS Technology with 11.8 ps Gate Delay," IEEE 1993, Washington, DC, pp. 131–134.

*Primary Examiner*—Wael Fahmy
*Attorney, Agent, or Firm*—Kenneth M. Seddon; Daniel R. Collopy

[57] ABSTRACT

A graded-channel semiconductor device (10) is formed in a pedestal (12). The pedestal (12) is formed on a substrate (11) and improves the electrical characteristics of the device (10) compared to conventional device structures. The pedestal (12) has sides (13) that are bordered by a first dielectric layer (24) to provide electrical isolation. An interconnect structure (90) can be optionally formed in conjunction with the formation of the device (10). The interconnect structure (90) has a plurality of conductors (60, 97) that can be used to transport electrical signals across the device (10).

17 Claims, 12 Drawing Sheets

SEMICONDUCTOR DEVICE HAVING A PEDESTAL

BACKGROUND OF THE INVENTION

This invention relates, in general, to insulated gate field effect transistors, and more particularly to short channel insulated gate field effect transistors.

Semiconductor devices such as insulated gate field effect transistor (IGFET) devices are becoming increasingly important in low voltage applications. As IGFET devices are scaled to smaller and smaller dimensions, manufacturers must refine transistor designs to maintain optimum device performance. Typically, in IGFET devices having channel lengths in the sub-micron range, manufacturers must carefully fabricate drain regions to avoid performance degradation problems such as hot carrier injection, drain leakage, punch-through, and the like.

In IGFET devices having channel lengths of about one micron, many device performance problems can be corrected by forming a lightly-doped-drain (LDD) region. The LDD region acts to lower the electric field in the channel region near the drain region. This reduced electric field improves threshold voltage stability by reducing hot carrier injection into the gate oxide layer overlying the channel region. However, the LDD region causes a reduction in performance because of an increase in source resistance, which negatively impacts transconductance. Also, as the channel length approaches 0.5 microns and below, drain engineering techniques (e.g., LDD regions) are not as effective in preventing performance degradation.

Additionally, manufacturers have used counter-doped source and drain regions to reduce sub-surface punch-through in short channel devices. These counter-doped regions are often referred to as "halo" regions. Although the halo regions are effective in reducing punch-through, they decrease carrier mobility in the channel region thereby degrading drive current. Also, the halo regions increase junction capacitance, which degrades switching speed performance.

Another approach to preventing performance degradation includes placing a higher doped region in the channel region between the source and drain region and extending from the surface down into the bulk semiconductor material. This higher doped region is of the same conductivity type as the channel region. Although this approach is effective in reducing punch-through, it also decreases carrier mobility in the channel region, which degrades drive current. In an alternative but similar approach, the higher doped region is placed in the channel region below the surface and contacting both the source region and the drain region. This alternative approach improves drive current capability but suffers from reduced breakdown voltage performance and a higher junction capacitance, which in turn degrades switching performance.

As is readily apparent, structures and methods are needed that overcome at least the above problems found in the prior art. It would be advantageous to manufacture such structures in a cost effective and reproducible manner. Additionally, it would be of further advantage for such structures to operate bi-directionally.

DETAILED DESCRIPTION OF THE DRAWINGS

In general, the present invention relates to a graded-channel semiconductor device suitable for sub-micron channel length designs. The device includes a source region and a drain region formed in a body of semiconductor material, with the body of semiconductor material being of opposite conductivity. The body of semiconductor material is first formed into a pedestal structure to improve the electrical characteristics of the graded-channel semiconductor device. In addition, the device has a doped region formed between the source region and the drain region to improve the punch-through resistance of the device. The method for forming the graded-channel semiconductor device as described below allows a device to be formed that has an effective channel length that is smaller than the minimum geometries that are possible using conventional photolithographic techniques. The device also exhibits improved performance characteristics compared to prior art structures.

The present invention also provides a conductive interconnect structure that can be used in conjunction with the graded-channel semiconductor device or in other semiconductor device applications. The interconnect structure can be used to provide electrical connections between neighboring device structures such that the electrical connections have an improved pitch. The pitch of an interconnect structure is the total width required to form a conductive layer and the space necessary to electrically isolate the conductive layer from neighboring conductive layers. The interconnect structure is well suited for use with the graded-channel semiconductor device of the present invention because the process to form the interconnect structure is easily integrated into the process flow to form the graded-channel semiconductor device.

Figure 1:
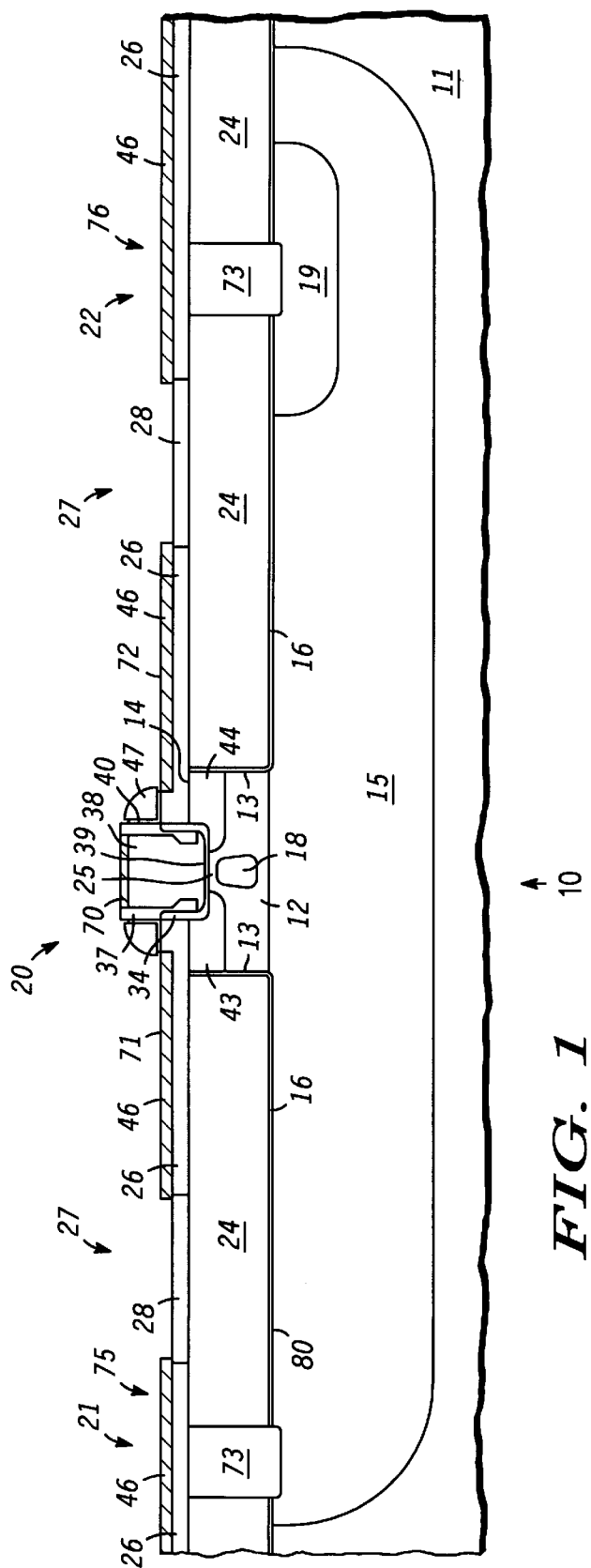
FIGS. 1–8 illustrate enlarged cross-sectional views of a graded-channel semiconductor device at various stages of fabrication in accordance with the present invention.

Turning now to the drawings to provide a more detailed description, FIG. 1 is provided to illustrate the features of a graded-channel semiconductor device, a semiconductor device, or a device 10 according to the present invention. For purposes of this description, device 10 is an n-channel IGFET device. This is intended as an example only and as those skilled in the art will appreciate, the present invention applies also to p-channel devices. Alternatively, the structure according to the present invention applies to complementary p-channel/n-channel configurations as well.

Device 10 is a semiconductor device formed in a semiconductor substrate 11 and comprises a gate structure 20. Gate structure 20 is used to modulate a channel 25 between a source region 43 and a drain region 44. A significant feature of device 10 is that source region 43 and drain region 44 are formed in a body of semiconductor material that is arranged as a pedestal 12 as shown in FIG. 1. Because portions of device 10 are formed in pedestal 12, many of the electrical characteristics of device 10 are improved. For example, the physical isolation provided to device 10 by pedestal 12 reduces the effects of leakage currents and voltage potentials that may be present in the underlying substrate 11. As a result, the breakdown voltage is significantly improved and the effects of parasitic bipolar structures are significantly reduced.

Device 10 also has a doped region 18, which is used to improve the punch-through resistance between source region 43 and drain region 44. Doped region 18 is formed below a major surface 14 of pedestal 12 and doped region 18 has a varying dopant concentration throughout as described below to maximize the ability of doped region 18 to prevent punch-through and adjust the threshold voltage of device 10.

As shown in FIG. 1, device 10 further comprises a buried interconnect region 19, a plug contact 21, and a plug contact 22. These structures are used as part of an optional interconnect structure to provide electrical connections for device 10 or neighboring device structures (not shown). The interconnect structure can also be used to electrically couple voltages to substrate 11 or to various doped regions formed in substrate 11. A further description of the interconnect structure and its applications will be provided shortly.

A more detailed description of the composition and function of elements of device 10 as shown in FIG. 1 is now provided. Device 10 includes a semiconductor substrate, a body of semiconductor material, or substrate 11, which comprises a semiconductor layer, a diffused well, a substrate region, an epitaxial region on a substrate, or the like. For an n-channel device, substrate 11 typically comprises a lightly doped epitaxial layer on a heavily doped substrate. The epitaxial layer having a boron doped (i.e., p-type conductivity) concentration having a background dopant concentration typically in a range from about $1.5 \times 10^{15}$ atoms/cm$^3$ to about $2.0 \times 10^{16}$ atoms/cm$^3$. Methods for forming substrate 11 are well known.

Device 10 also includes source region 43 and drain region 44 that extend from major surface 14 to a depth of about 0.1 microns to about 0.3 microns. Source region 43 and drain region 44 are n-type conductivity regions having a surface concentration on the order of $1.0 \times 10^{20}$ atoms/cm$^3$. Source region 43 and drain region 44 are, for example, spaced apart a distance in a range from about 0.25 microns to 0.5 microns. As photolithographic techniques evolve to economically produce smaller dimensions, this distance is scaleable according to classic metal-oxide semiconductor (MOS) scaling techniques.

Gate structure 20 of device 10 is formed adjacent to channel region 25 and includes, for example, a region of conductive material 38 electrically insulated from channel region 25 by gate dielectric layer 39. Gate dielectric layer 39 preferably comprises an oxide and has a thickness in a range from about 30 angstroms to about 100 angstroms. To modulate channel region 25, a voltage potential is placed on conductive material 38 using a gate electrode 70. Gate electrode 70 is formed from a conductive material, which improves the electrical characteristics of conductive material 38.

A portion of conductive material 38 overlaps at least a portion of the junction formed by source region 43 and pedestal 12 and at least a portion of the junction formed by drain region 44 and pedestal 12. By overlapping a portion of source region 43 and drain region 44, gate control of gate structure 20 is effective across channel region 25. This also significantly enhances device reliability and manufacturability. Insufficient overlap results in erratic manufacturing yields and degrades device performance.

Gate structure 20 also includes a second thermal oxide layer 34 and first spacers 37, which are used to provide physical and electrical isolation between gate electrode 70 and electrodes 71 and 72. Electrodes 71 and 72 are electrically coupled to source region 43 and drain region 44 respectively. In addition, FIG. 1 illustrates the use of second spacers 47, which may be optionally formed to provide further isolation between gate electrode 70 and electrodes 71 and 72.

According to the present invention, a doped region 18 is formed in channel region 25 and is vertically spaced apart from (i.e., it does not directly contact) major surface 14. Additionally, doped region 18 is both vertically and laterally spaced apart from source region 43 and drain region 44. Further, the lateral extension of doped region 18 is defined independently of the distance between source region 43 and drain region 44.

Doped region 18 is of the same conductivity type as pedestal 12, but has a higher dopant concentration. Additionally, doped region 18 extends into pedestal 12 to a depth greater than about 0.3 microns. Preferably, doped region 18 is a region having a dopant concentration greater than or equal to approximately $3.0 \times 10^{17}$ atoms/cm$^3$ (i.e., doped region 18 preferably has a dopant concentration at least an order magnitude greater than the background concentration of pedestal 12 and substrate 11).

Preferably, source region 43 and drain region 44 are self-aligned to doped region 18 in order to provide bi-directional device operation (i.e., doped region 18 is substantially centrally located between source region 43 and drain region 44). Preferably, doped region 18 is at least 125 angstroms below major surface 14 with a distance of about 800 angstroms preferred. According to the present invention, the distance that doped region 18 is spaced from major surface 14 contributes to establishing the threshold voltage of graded-channel semiconductor device 10.

Doped region 18 provides a localized area of charge that functions, among other things, to enhance punch-through resistance. Also, because doped region 18 is spaced apart from source region 43 and drain region 44, device 10 exhibits improved breakdown voltage characteristics, improved switching speeds due to reduced junction capacitance, and improved resistance to hot-carrier injection effects compared to prior art structures where the center doped region contacts the source and drain region. Additionally, because doped region 18 is spaced apart from major surface 14, device 10 exhibits a lower threshold voltage and improved drive capability (i.e., higher transconductance) compared to prior art structures having substantially constant channel doping in the center of the channel that extends all the way to the surface (i.e., extends completely to the surface of the channel region).

The location of doped region 18 and thickness of gate dielectric layer 39 can be varied to produce devices with various characteristics. For example, with doped region 18 spaced a distance of about 1,125 angstroms from major surface 14 and with gate dielectric layer 39 having a thickness of about 90 angstroms, device 10 exhibits a leakage current (Idss) on the order of 40 nano-amps/micron (at a Vds of 1.8 volts), a threshold voltage on the order of 165 millivolts, a peak transconductance on the order of 65 Siemens/meter, a drive current (Idsat) on the order of 790 micro-amps/micron (at a Vds of 3.3 volts), 555 micro-amps/micron (at a Vds of 2.5 volts), and a breakdown voltage (BVdss) on the order of 7.5 volts.

With doped region 18 spaced a distance of about 800 angstroms from major surface 14 and with gate dielectric layer 39 having a thickness of about 90 angstroms, graded-channel device 10 exhibits an Idss on the order of 1.0 nano-amp/micron (at a Vds of 1.8 volts), a threshold voltage on the order of 300 millivolts, a peak transconductance on the order of 60 Siemens/meter, an Idsat on the order of 730 micro-amps/micron (at a Vds of 3.3 volts), an Idsat on the order of 500 micro-amps/micron (at a Vds of 2.5), and a BVdss on the order of 8.0 volts.

With doped region 18 spaced a distance of about 150 angstroms from major surface 14 and with gate dielectric layer 39 having a thickness of about 90 angstroms, graded-channel device 10 exhibits an Idss on the order of 1.0 pico-amp/micron (at a Vds of 1.8 volts), a threshold voltage on the order of 575 millivolts, a peak transconductance on the order of 53 Siemens/meter, an Idsat on the order of 620 micro-amps (at a Vds of 3.3 volts), an Idsat on the order of 400 micro-amps/micron (at a Vds of 2.5 volts), and a BVdss on the order of 8.25 volts. All of the above examples are drawn with dimensions such that the width of gate structure 20 is about 0.5 microns.

In contrast to the above examples, comparable prior art structures having a 0.5 micron drawn gate dimension and a 90 angstrom gate oxide typically exhibit Idsat values on the order of 400 micro-amps/micron at 3.3 volts and an Idss of about 1.0 nano-amp/micron. Comparable prior art structures having a 0.35 micron drawn gate length and a 90 angstrom gate oxide typically exhibit Idsat values on the order of 450 micro-amps/micron at 2.5 volts and an Idss of about 1.0 nano-amp/micron. As is readily apparent, device 10 featuring 1.0 nano-amp/micron Idss capability also shows a significant improvement in Idsat compared to the prior art structures.

First dielectric layer 24 is used to provide electrical and physical isolation between various elements of FIG. 1. For example, first dielectric layer 24 electrically isolates source region 43 and drain region 44 from any neighboring device structures. The electrical isolation provided by first dielectric layer 24 is comparable to the use of field oxide structures in conventional MOS devices. First dielectric layer 24 is also used to provide electrical isolation as part of the interconnect structure of the present invention as will become more apparent with the description to follow.

Also shown in FIG. 1 are portions of an interconnect structure that can be optionally formed in conjunction with device 10 of the present invention or with many conventional semiconductor device structures. Plug contact 21 comprises a plug region 73, which is used to provide electrical coupling between well region 15 and a contact electrode 75. Plug contact 22 also comprises a plug region 73, which is used to electrically couple buried interconnect region 19 to a contact electrode 76. It should also be understood that plug contacts 21 or 22 could also be used to electrically couple a contact electrode (not shown) to substrate 11 and that plug contacts 21 and 22 are used to pass voltage levels or electronic signals through a first dielectric layer 24.

Figure 2:
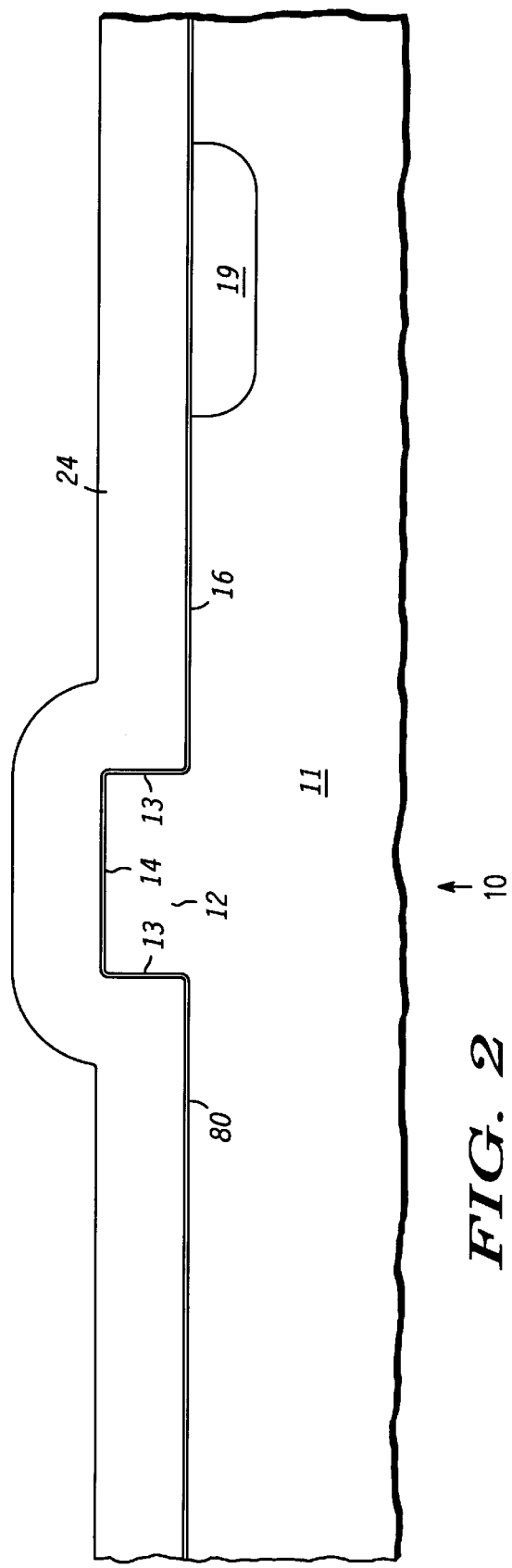

Turning now to FIGS. 2–8, a preferred method for forming device 10 is described. During the description pertaining to the formation of device 10, details will be provided on how to form portions of an interconnect structure. These details illustrate how the formation of the interconnect structure can be integrated into the process flow of device 10. A more elaborate description of the interconnect structure and its formation will be provided below. FIG. 2 illustrates an enlarged cross-sectional view of substrate 11 at an early stage of processing. The upper portion of substrate 11 is preferably a lightly doped p-type body of silicon and may be formed by a lightly doped p-type layer on a heavily doped p-type substrate. The formation of device 10 begins with the formation of pedestal 12.

A first masking layer (not shown) is patterned on substrate 11, which acts as a hard mask to define pedestal 12. Preferably, the first masking layer is a 800 angstrom to 2,000 angstrom thick film of silicon dioxide that is grown on substrate 11 and patterned using a photolithographic process. A timed reactive ion etch (RIE) is used to remove the portions of substrate 11 that are not covered by the first masking layer. Pedestal 12 is the remaining raised portion of substrate 11 that is covered by the first masking layer. Pedestal 12 is elevated about 3,000 angstroms to 10,000 angstroms above a surface 80 of substrate 11 and is about 5,000 angstroms to 30,000 angstroms wide. The width of pedestal 12 is defined as the distance between the sides 13 of pedestal 12 as shown in FIG. 2. Pedestal 12 further comprises a major surface 14 on which portions of device 10 will be formed.

Following the removal of the first masking layer, a first thermal oxide layer 16 with a thickness of about 100 angstroms to 500 angstroms is grown on surface 80, sides 13, and major surface 14. If desired, a photolithographic masking step, an implant step, and an anneal step can be performed to form the optional buried interconnect region 19 as shown in FIG. 2. An arsenic implant dose on the order of $1.0 \times 10^{15}$ atoms/cm$^2$ to $1.0 \times 10^{16}$ atoms/cm$^2$ and an implant energy on the order of 80 keV is suitable for forming buried interconnect region 19. Following the formation of buried interconnect region 19, first dielectric layer 24 is deposited onto surface 80, sides 13, and major surface 14. Preferably, first dielectric layer 24 is deposited using well known deposition techniques (e.g., low pressure chemical vapor deposition (CVD), plasma enhanced CVD, etc.) and comprises a material such as silicon dioxide formed from the decomposition of tetraethylorthosilicate (TEOS). First dielectric layer 24 is about 4,000 angstroms to 13,000 angstroms thick and should be thick enough to cover sides 13 of pedestal 12.

Figure 3:
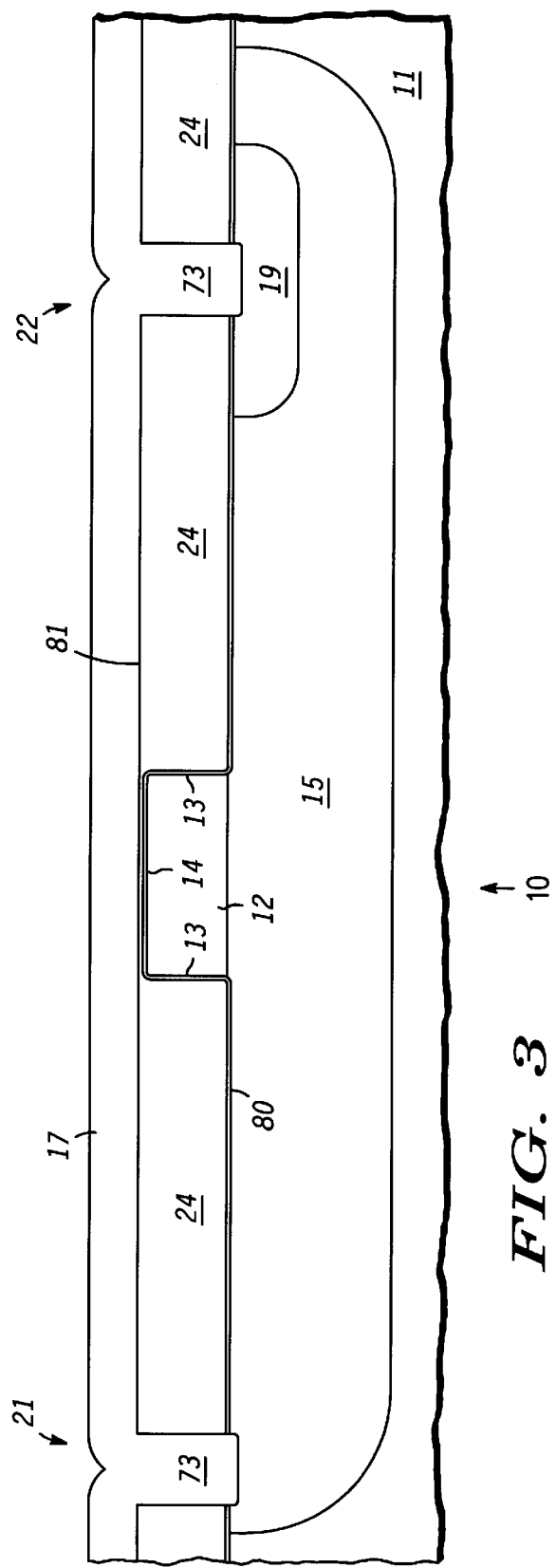

Referring now to FIG. 3, first dielectric layer 24 is then planarized to provide a first planar surface 81. First dielectric layer 24 can be planarized with either a chemical mechanical polishing (CMP) technique or a photolithographic negative-layer (n-layer) process, both of which are well known. The planarizing process preferably leaves a portion of first dielectric layer 24 and first thermal oxide layer 16 on major surface 14 of pedestal 12. It should also be understood that all of first dielectric layer 24 and first thermal oxide layer 16 can be removed from major surface 14 during the planarizing process. Well region 15 is then formed by implanting substrate 11 through first planar surface 81 and is used to prevent the electrical inversion of surface 80 between device 10 and possible surrounding devices not shown. A boron implant dose on the order of $1.0 \times 10^{12}$ atoms/cm$^2$ to $1.0 \times 10^{13}$ atoms/cm$^2$ and an implant energy on the order of 60 keV is suitable for forming well region 15.

Still referring to FIG. 3, as part of the interconnect structure of the present invention, openings may be optionally formed in first dielectric layer 24 for the formation of plug contacts 21 and 22. Again, the formation of the interconnect structure is not required for the formation of device 10. A photolithographic masking pattern (not shown) is used to expose the portions of first dielectric layer 24 where plug contacts 21 and 22 are formed. An RIE etch is then use to remove the exposed portions of first dielectric layer 24 and expose portions of the underlying well region 15 and buried interconnect region 19.

A first coupling layer 17 is then formed on first planar surface 81 and in the openings of plug contacts 21 and 22 as shown in FIG. 3. First coupling layer 17 is made from a conductive material and is used primarily to form plug regions 73. Plug regions 73 are used in plug contacts 21 and 22 to electrically couple to well region 15 and buried interconnect region 19 respectively. First coupling layer 17 can comprise a variety of conductive materials such as polysilicon, doped silicon, tungsten, cobalt, chromium, or the like. Such materials can be deposited using a CVD process, a plasma enhanced chemical vapor deposition (PECVD) process, or by a sputtering process.

Figure 4:
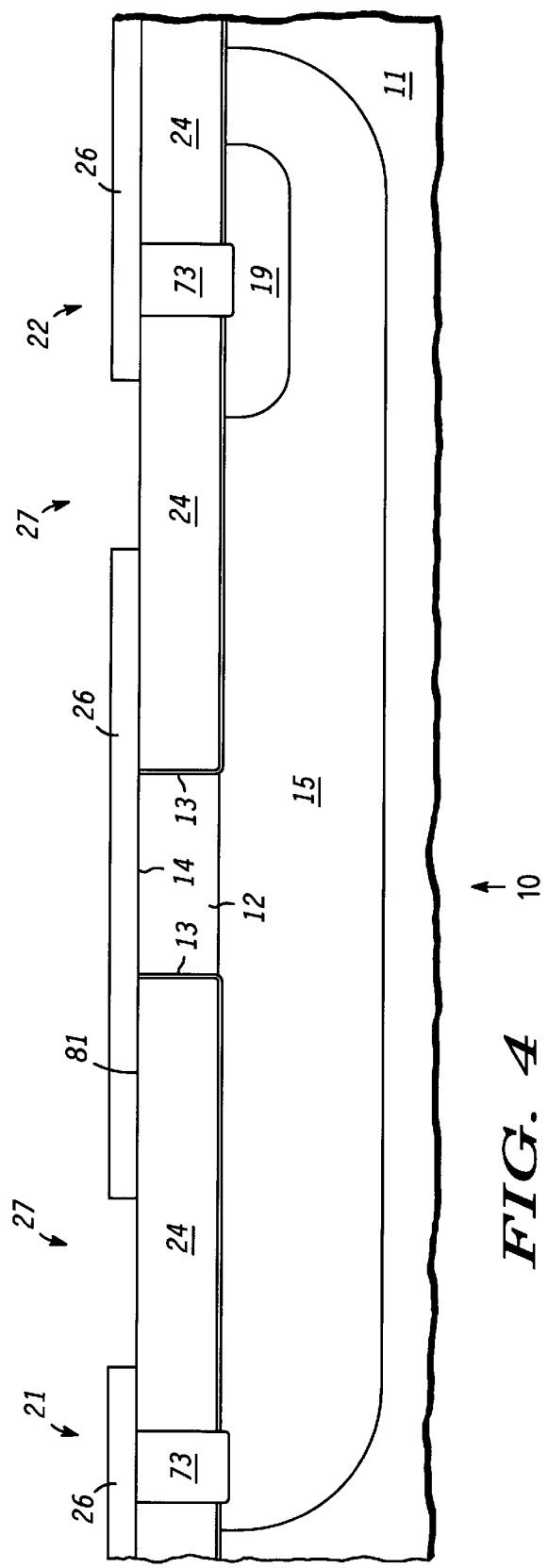

Referring now to FIG. 4, the portions of first coupling layer 17 on first planar surface 81 and over major surface 14 have been removed with either an etch or a CMP process. This will electrically isolate each of plug regions 73 from each other. Any remaining portions of first dielectric layer 24 or first thermal oxide layer 16 on major surface 14 of pedestal 12 are then removed. A first polysilicon layer 26 is then deposited onto major surface 14 and first planar surface 81. First polysilicon layer 26 is about 500 angstroms to 2,000 angstroms thick and is in direct physical contact with the silicon material of pedestal 12. First polysilicon layer 26 is also in contact with plug regions 73 of plug contacts 21 and 22. A photolithographic masking pattern (not shown) and an RIE etch process are used to remove portions of first polysilicon layer 26 to electrically isolate the portion of first polysilicon layer 26 over pedestal 12 from the portions of first polysilicon layer 26 over plug regions 73. This electrical isolation is shown in FIG. 4 as openings 27. After the formation of openings 27, the photolithographic mask is removed to allow further processing.

Figure 5:
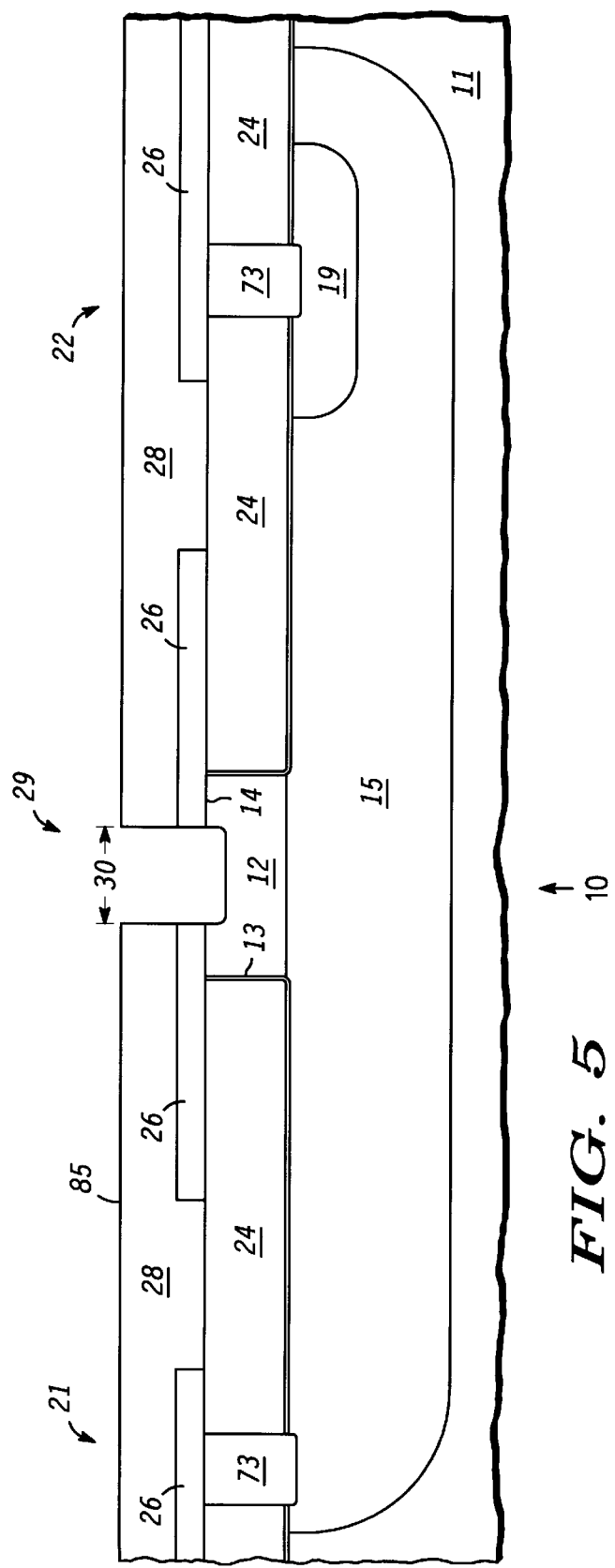

FIG. 5 illustrates substrate 11 at a subsequent step of manufacture. In particular, FIG. 5 shows substrate 11 with a second dielectric layer 28 formed on first polysilicon layer 26 and the exposed portions of first dielectric layer 24. Preferably, second dielectric layer 28 is a 4,000 angstrom to 7,000 angstrom thick layer of silicon oxide that is formed from a CVD deposition process. A second planar surface 85 is then formed on second dielectric layer 28 using a CMP process. Second planar surface 85 of second dielectric layer 28 is then patterned with a photolithographic pattern (not shown) to form a gate opening 29, which has, for example, a width 30 on the order of 0.4 microns to 0.6 microns. Subsequent reference to the figures and the description will assume that gate opening 29 is 0.5 microns wide. This establishes a drawn gate dimension. Techniques for forming gate opening 29 are well known in the art. As stated above, as photolithographic capabilities evolve to economically produce smaller dimensions, width 30 is scaleable using classic MOS scaling techniques.

To form gate opening 29, a reactive ion etch is used to remove the exposed portions of second dielectric layer 28 and first polysilicon layer 26. Preferably, the RIE etch process includes a timed over etch so that a portion of pedestal 12 at major surface 14 is also removed. It should also be understood that the RIE etch process can be modified so that a thin portion of first polysilicon layer 26 is left in gate opening 29 so no part of pedestal 12 is removed.

Figure 6:
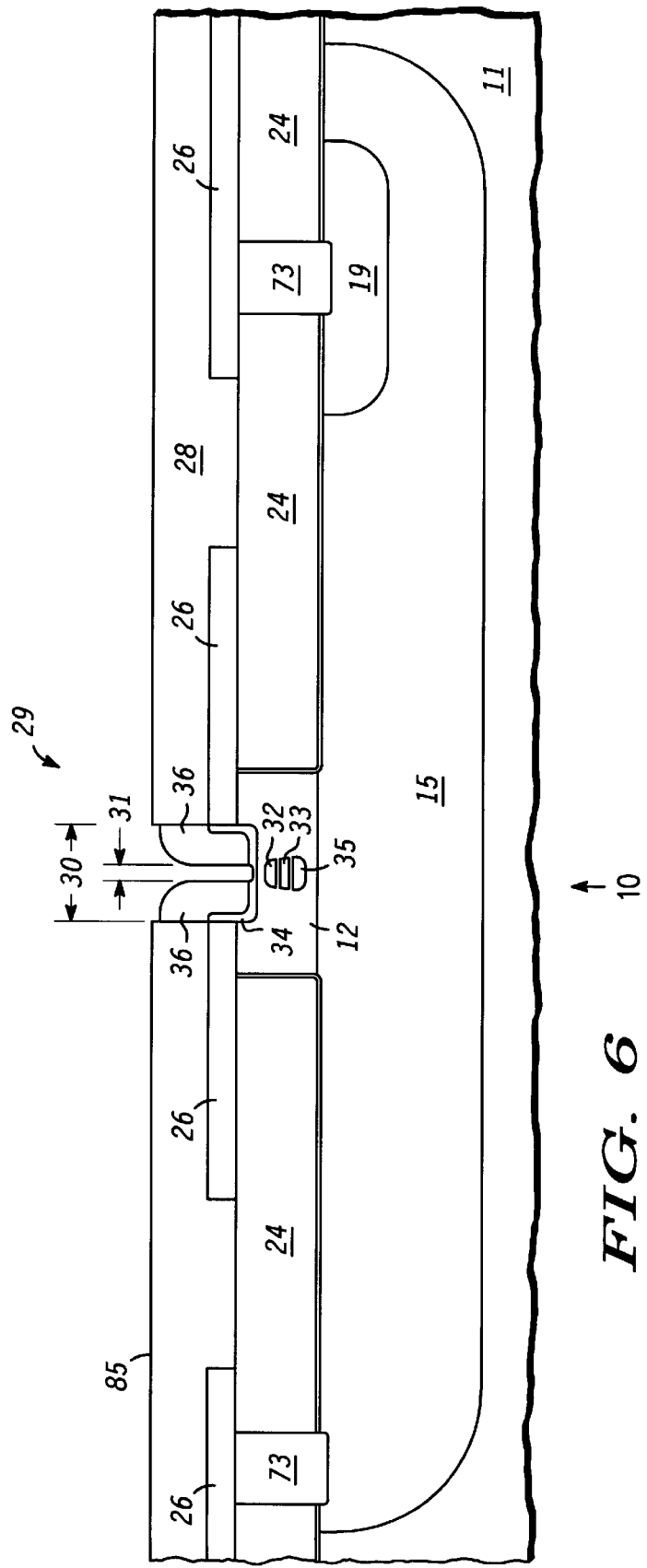

FIG. 6 illustrates device 10 at a subsequent step of manufacture. In particular, FIG. 6 shows substrate 11 after second thermal oxide 34 has been formed on the exposed portions of first polysilicon layer 26 and major surface 14. Second thermal oxide layer 34 is about 100 angstroms to 500 angstroms thick and can be formed by placing substrate 11 into a high temperature, oxidizing ambient. Temporary spacers 36 are then formed by depositing a material such as a polysilicon layer (not shown) onto second planar surface 85 and into gate opening 29. The thickness of the polysilicon layer is selected based upon the desired width of each temporary spacer 36 and thus a desired aperture width 31 to subsequently form doped region 18 (see FIG. 1). For example, to provide an aperture width 31 of about 0.15 microns, the polysilicon layer has a thickness of about 1,750 angstroms. This is based on the well known relationship that aperture width 31 is approximately equal to width 30 minus two times the thickness of the polysilicon layer.

Once the second polysilicon layer is formed, the layer is anisotropically etched to form temporary spacers 36 as shown in FIG. 6. The anisotropic etch removes the portions of the polysilicon layer on major surface 14 and provides aperture width 31. The polysilicon layer is etched using, for example, well known reactive ion etching (RIE) techniques. Temporary spacers 36 provide the sub-photolithographic aspect of doped region 18. Alternatively, temporary spacers could be formed using silicon nitride.

Following the formation of temporary spacers 36, doped region 18 (see FIG. 1) is formed preferably using ion implantation and annealing techniques. For a 1.0 nano-amp/micron Idss device, doped region 18 preferably is formed by a series of ion implants including, a first boron implant dose of about $7.0 \times 10^{12}$ atoms/cm$^2$ at an energy of about 80 keV (represented by region 35), a second boron implant dose of about $7.0 \times 10^{12}$ atoms/cm$^2$ at 40 keV (represented by region 33), and a third boron implant dose of about $4.0 \times 10^{11}$ atoms/cm$^2$ at an energy of about 10 keV (represented by region 32).

For a 1.0 pico-amp/micron Idss device, the first and second boron implant are the same as above, but the third boron implant dose is on the order of about $3.0 \times 10^{12}$ atoms/cm$^2$ at an energy of about 10 keV. For a 40 nano-amp/micron Idss device, the first boron implant is the same as above, but the second boron implant is on the order of $7.0 \times 10^{12}$ atoms/cm$^2$ at 50 keV and the third boron implant is not done (i.e., region 32 is not formed). In general, the implant energy is selected for doping regions 32, 33, and 35 so that once regions 32, 33, and 35 are annealed to form doped region 18, doped region 18 is spaced a distance from major surface 14 on the order of at least 125 angstroms.

Figure 7:
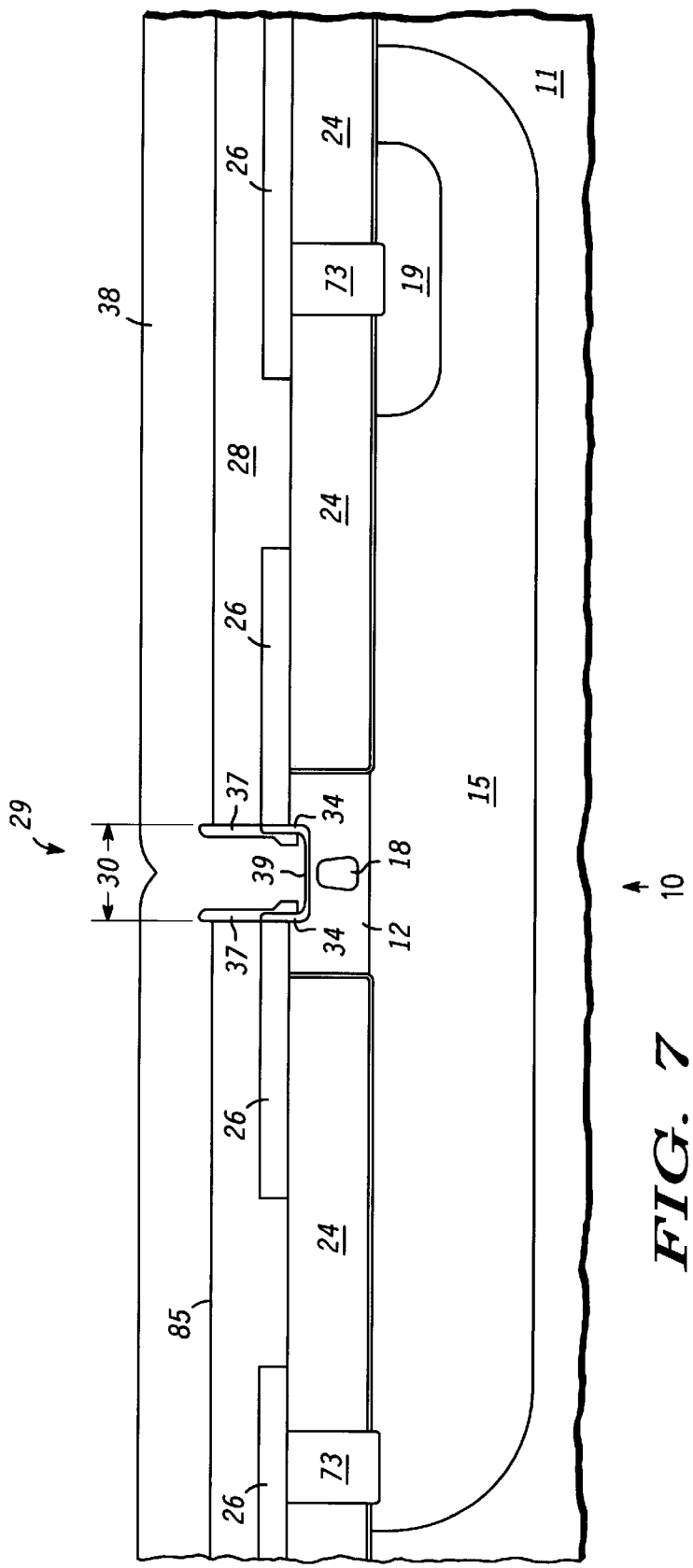

Referring now to FIG. 7, following ion implantation, temporary spacers 36 are removed using well known techniques. Next, a layer of silicon nitride (not shown) is deposited onto second planar surface 85 and into gate opening 29. The layer of silicon nitride is also formed on second thermal oxide layer 34 overlying major surface 14. Then the layer of silicon nitride is anisotropically etched to form first spacers 37 as shown in FIG. 7. The anisotropic etch removes the layer of silicon nitride on second thermal oxide layer 34 over major surface 14. A wet etch is then used to remove the portions of second thermal oxide layer 34 that were exposed by the anisotropic etch used to form first spacers 37. The wet etch leaves portions of second thermal oxide layer 34 between first spacers 37 and first polysilicon layer 26 on pedestal 12. The wet etch can also remove a portion of pedestal 12 to clean major surface 14 for subsequent processing.

A gate dielectric layer 39 is then formed as shown in FIG. 7. Preferably, gate dielectric layer 39 comprises a thermal oxide and has a thickness on the order of about 30 angstroms to about 100 angstroms (90 angstroms was used for the examples provided above). During the formation of gate dielectric layer 39, regions 32, 33 and 35 are annealed to activate the implanted dopant to form doped region 18.

Following the formation of gate dielectric layer 39, a layer of conductive material 38 is formed over major surface 14, second planar surface 85, and into gate opening 29. Conductive layer 38 preferably comprises polysilicon or amorphous silicon and in this example, has a thickness on the order of 4,000 angstroms. This thickness varies depending on width 30 of gate opening 39. Methods for forming layer 38 are well known. It should also be understood that the gate structure of device 10 can be formed from other materials used in the semiconductor industry such as cobalt, tungsten, molybdenum, or the like.

Figure 8:
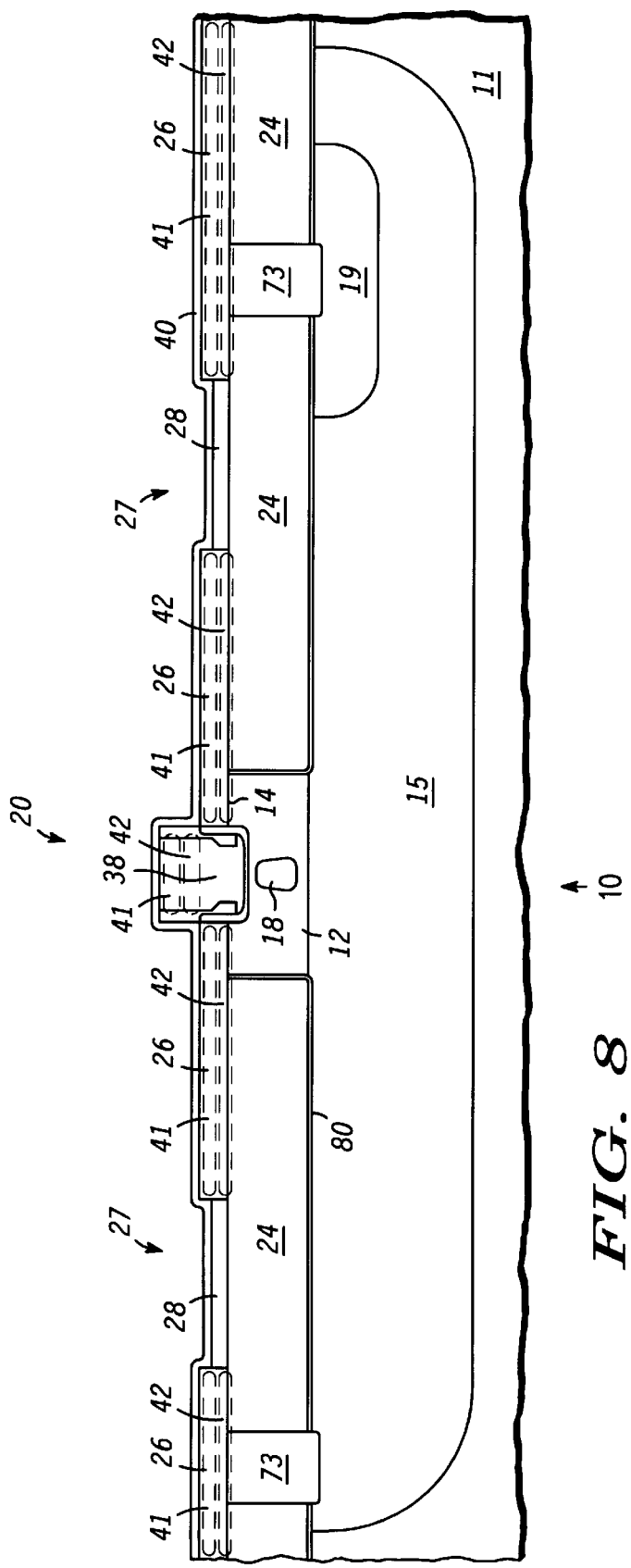

FIG. 8 illustrates device 10 at a subsequent step in manufacture. In particular, FIG. 8 shows substrate 11 after layer 38 has been planarized. For example, layer 38 is planarized using chemical mechanical polishing (CMP) techniques, which are well known. After layer 38 is planarized, a portion of layer 38 remains in gate opening 29 and becomes a portion of gate structure 20 (see FIG. 1). The portion of layer 38 that remains in gate opening 29 typically has a thickness on the order of 3,500 angstroms to 6,000 angstroms.

Following the planarization of layer 38, portions of second dielectric layer 28 are removed using, for example, conventional wet etching techniques to form the structure shown in FIG. 8. The portion of second dielectric layer 28 overlying gate structure 20 and first polysilicon layer 26 is removed. A portion of second dielectric layer 28 may be left in openings 27 as shown in FIG. 8. A third dielectric layer 40 is then formed on the exposed surfaces of gate structure 20 and first layer of polysilicon 26. Preferably, third dielectric layer 40 is about 100 angstroms to 500 angstroms thick and is formed from the chemical vapor deposition of silicon dioxide.

Third dielectric layer 40 is used as a screen oxide for the subsequent implant steps used to form a first doped region 41 and a second doped region 42. First doped region 41 is formed with a n-type dopant (e.g., phosphorous) that is ion implanted into first polysilicon layer 26 and is performed to enhance the electrical characteristics of first polysilicon layer 26. Second doped region 42 is formed such that a portion of the dopant extends below major surface 14 into pedestal 12, which is used to form source region 43 and drain region 44 (see FIG. 1). Note that a portion of second doped region 42 also extends into plug regions 73, which only further serves to enhance the electrical characteristics of plug contacts 21 and 22. It should also be understood that the conductivity of plug contacts 21 and 22 could be doped to be of opposite conductivity if p-channel devices (not shown) are formed on semiconductor substrate 11.

In FIG. 8, only the areas of first doped region 41 and a second doped region 42 in first polysilicon layer 26 are shown. It should be understood that dopant will also enter portions of first dielectric layer 28. A key feature of the implantation steps is that these steps are self-aligned to gate structure 20. This allows gate structure 20 to overlap source region 43 and drain region 44 after first doped region 41 and a second doped region 42 have been annealed (as described below). This adds to device reliability and greatly enhances manufacturability. Additionally, this eliminates the need for source and drain extensions, which add processing steps and degrade device performance.

An implant dose on the order of $1.0 \times 10^{15}$ atoms/cm$^2$ to $1.0 \times 10^{16}$ atoms/cm$^2$ and an implant energy on the order of 60 keV is suitable for forming first doped region 41. An implant dose on the order of $1.0 \times 10^{15}$ atoms/cm$^2$ to $1.0 \times 10^{16}$ atoms/cm$^2$ and an implant energy on the order of 160 kev is suitable for forming second doped region 42. Again, the dopant from the implantation step used to form second doped region 42 extends into pedestal 12 and is used to form source region 43 and drain region 44. Following ion implantation, the implanted dopant of first doped region 41 and a second doped region 42 is activated using conventional rapid thermal anneal techniques to form source region 43 and drain region 44 as shown in FIG. 1. Preferably, source region 43 and drain region 44 are formed so they are elevated above first surface 80 of substrate 11. An anneal of about 40 seconds at about 1050° C. is suitable. Alternatively, an equivalent furnace anneal is used. After the anneal, doped region 18 has a width of less than 0.3 microns, with a width on the order of 0.15 micron to about 0.25 micron being typical.

Referring now to FIG. 1, the final process steps of device 10 will be provided. Third dielectric layer 40 is removed using a conventional wet etch process. Next, a spacer layer (not shown) is deposited onto gate structure 20, first polysilicon layer 26, and first dielectric layer 28 followed by a conventional reactive ion etch to form second spacers 47 as shown in FIG. 1. The spacer layer preferably comprises silicon nitride, and the use of second spacers 47 is optional and can be used in the formation of source electrode 71, drain electrode 72, and gate electrode 70.

Next, source electrode 71, drain electrode 72, and gate electrode 70 are formed using, for example, conventional self-aligned silicide techniques. Preferably, source electrode 71, drain electrode 72, and gate electrode 70 have a conductive layer 46 that is formed on all exposed surfaces of first polysilicon layer 26 and second polysilicon layer 38. Conductive layer 46 is formed to enhance the electrical properties of first polysilicon layer 26 and second polysilicon layer 38 and comprises titanium silicide, cobalt silicide, or the like. The above method provides a self-aligned graded-channel device 10 having sub-photolithographic features. This provides a graded-channel device having bi-directional high performance characteristics with an enhanced punch-through resistance.

Figure 9:
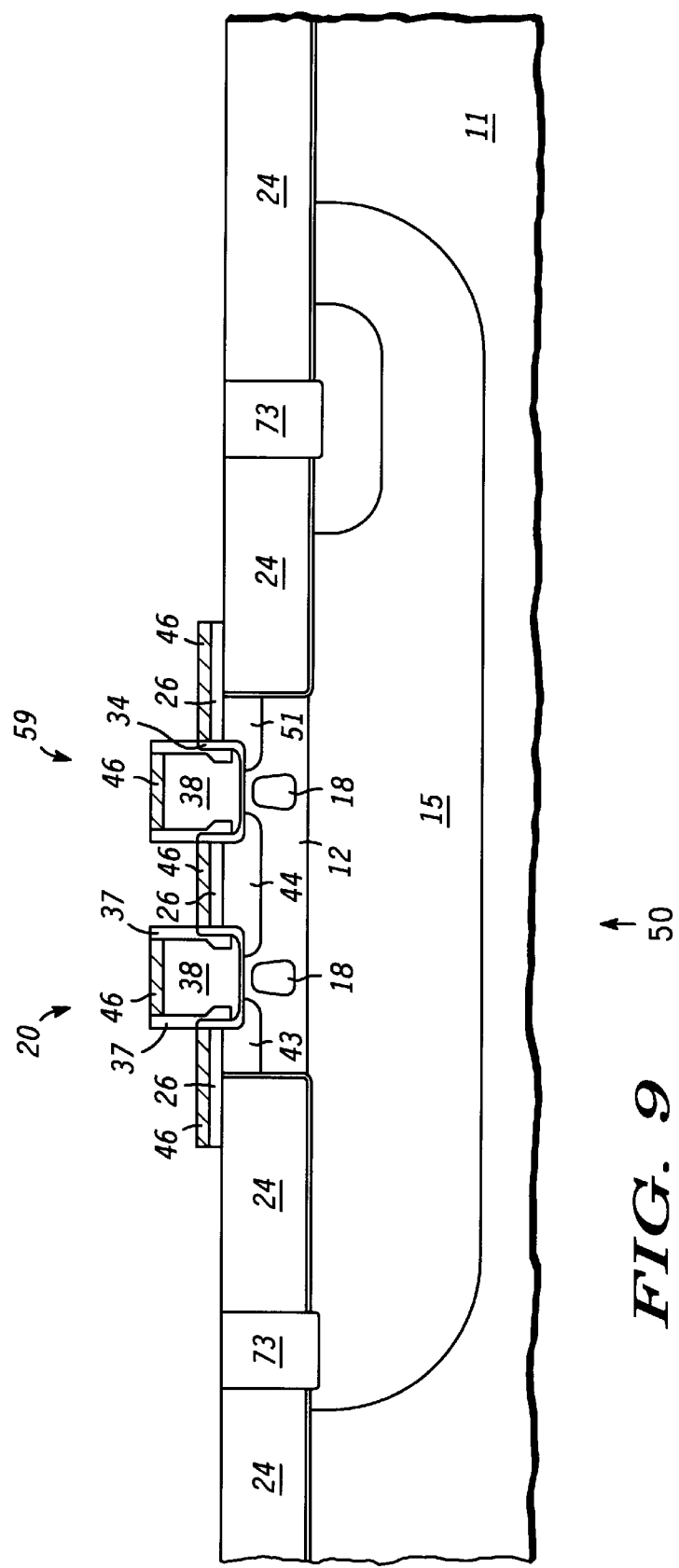
FIG. 9 illustrates an enlarged cross-sectional view of an alternate embodiment of the graded-channel semiconductor device of the present invention.

FIG. 9 illustrates an alternate configuration of a device according to the present invention. FIG. 9 shows a dual gate n-channel device 50 embodying many of the elements of the present invention. Dual gate n-channel device 50 is formed by two semiconductor devices, designated by gate structure 20 and gate structure 59, which are formed in the same pedestal 12. The device of gate structure 20 has a source region 43, a drain region 44, and a doped region 18 all described above and shown in FIG. 1. The device of gate structure 59 is an additional device that is formed in conjunction with device 10 and uses a portion of drain region 44 as its source and has its own drain region 51. Gate structure 20 and gate structure 59 act as the two input terminals of dual gate n-channel device 50, and dual gate n-channel device 50 is formed using the same process as described above.

The present invention also provides for an interconnect structure or interconnect methodology that can be used to provide electrical connections within semiconductor devices and between neighboring semiconductor device structures. A significant feature of the interconnect structure is that it forms electrical connections at a finer pitch than is possible with conventional photolithographic techniques. An additional benefit of the interconnect structure of the present invention is that it is easily integrated into the process flow to form device 10 described above. In the following description, an alternate method for forming device 10 is provided to further simplify the integration of the formation of an interconnect structure into the process used to form device 10.

Figure 10:
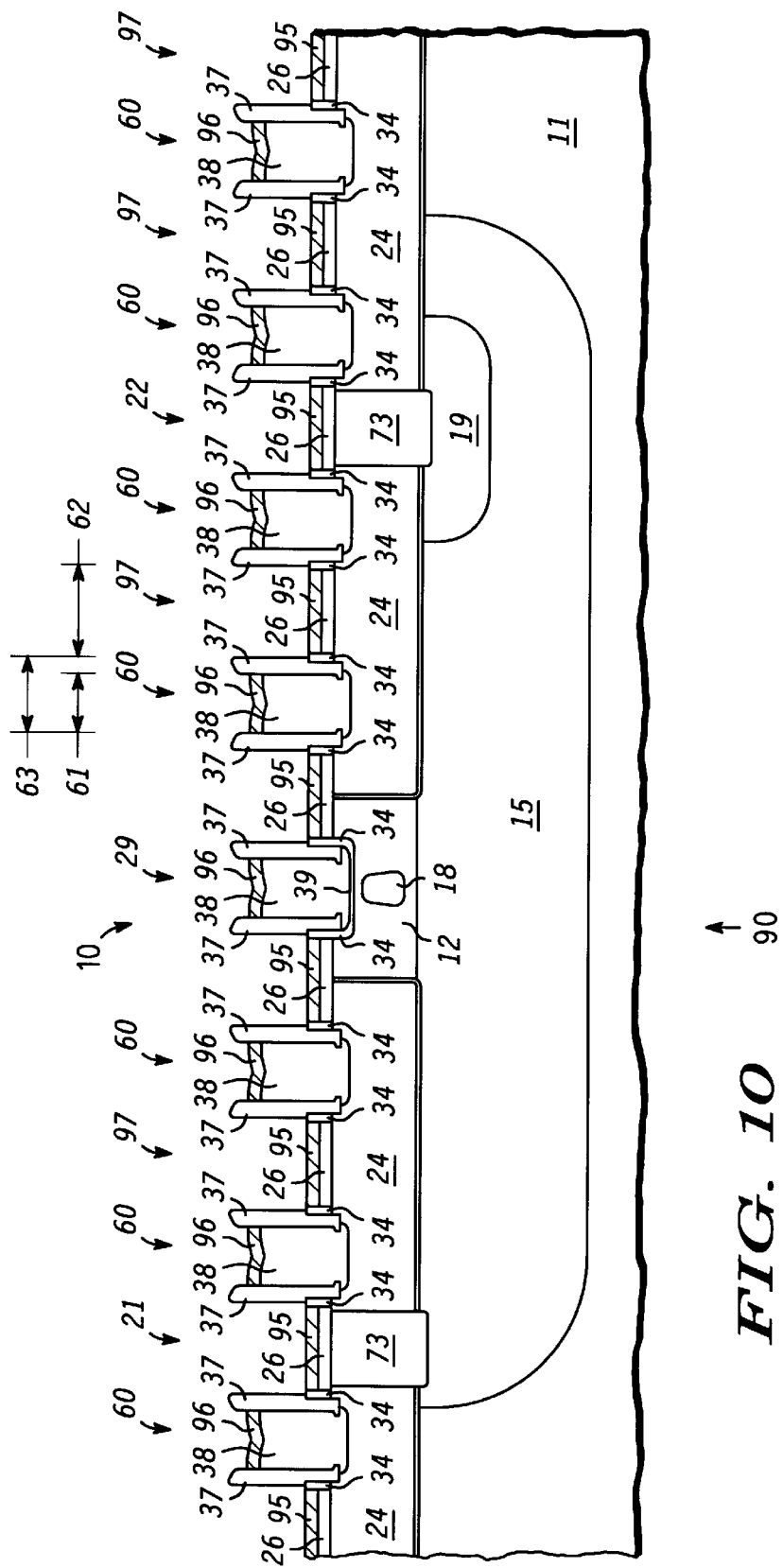
FIGS. 10–12 illustrate enlarged cross-sectional views of an interconnect structure at various stages of fabrication according to the present invention.

Turning now to FIG. 10, a general description of an interconnect structure 90 will be provided. Interconnect structure 90 includes, in this embodiment, a semiconductor device such as device 10 or 50 described above. It should also be understood that the elements of interconnect structure 90 can be used with many conventional semiconductor devices having a structure different than device 10 or 50. Interconnect structure 90 comprises two conductive layers, a first conductor 60 and a second conductor 97, that are used to transport electrical signals or voltage potentials to neighboring devices structures (not shown). In FIG. 10, first conductor 60 and second conductor 97 are shown in a repeating pattern across interconnect structure 90 to demonstrate the high packing density or small pitch of the present invention.

As shown in FIG. 10, first conductor 60 comprises a conductive layer 96 formed on second polysilicon layer 38. In the following method for making interconnect structure 90, second polysilicon layer 38 is used to form part of first conductor 60. This is shown to demonstrate how interconnect structure 90 can be integrated into the formation of gate structure 20 of device 10. It should be understood that first conductor 60 can be formed from a single layer of conductive material and that the use of conductive layer 96 is optional.

Second conductor 97 comprises a conductive layer 95 formed on first polysilicon layer 26. In the following method for making interconnect structure 90, first polysilicon layer 26 is used to form part of second conductor 97. This is shown to demonstrate how interconnect structure 90 can be integrated into the formation of device 10. It should be understood that second conductor 97 can be formed from a single layer of conductive material and that the use of conductive layer 95 is optional. Conductive layers 95 and 96 preferably comprise a metallic compound made from materials such as cobalt, chromium, molybdenum, or titanium.

First conductor 60 is preferably formed from a layer of polysilicon that is physically isolated from second conductor 97 by first spacers 37. First spacers 37 can be the same spacers used to define gate structure 20 in FIG. 1. This simplifies the processing steps necessary to form interconnect structure 90. First spacers 37 have an interior side, which is defined as the side that physically contacts second polysilicon layer 38. First spacers 37 also have an exterior side, which is defined as the portions of first spacers 37 that contact second conductor 97. As shown in FIG. 10, first conductor 60 has a width 61 that is defined as the distance separating the interior side of first spacers 37. Second conductor 97 has a width 62 that is defined as the width of the exterior side of first spacers 37 minus the portion of first polysilicon layer 26 that is lost due to the formation of second thermal oxide layer 34. Therefore, the effective pitch of the present invention is width 63, which is the sum of width 61 and the width of one first spacer 37. The effective pitch of interconnect structure 90 can also be defined as the width of one of first spacers 37 and the thickness of second thermal layer 34, plus the average width of first conductor 60 and second conductor 97.

Referring to a conventional process to form a semiconductor device, the pitch of an interconnect layer refers to the width of the interconnect layer plus the width of the space between neighboring lines of the interconnect layer. For example, a conventional photolithographic process that has a minimum feature size of 0.5 µm is limited to a pitch of 1.0 µm (i.e., 0.5 µm for the interconnect layer and 0.5 µm for the space to isolate the interconnect layer).

The dimensions of interconnect structure 90 of the present invention are not limited by the photolithographic process and offer a much improved pitch versus conventional processes. Since first conductor 60 and second conductor 97 are self-aligned and separated by at least one spacer, there is no need to rely on the photolithographic process to physically isolate conductors 60 and 97. For example, if a photolithographic process with a minimum geometry capability of 0.5 µm is used to form interconnect structure 90, then the pitch of the structure is approximately 0.5 µm (i.e., 0.4 µm for either width 61 of first conductor 60 or width 62 of second conductor 97, and approximately 0.1 µm for spacer 37). Therefore, the average pitch of interconnect structure 90 is substantially equal to the capability of the photolithographic process used to define interconnect structure 90.

Figure 11:
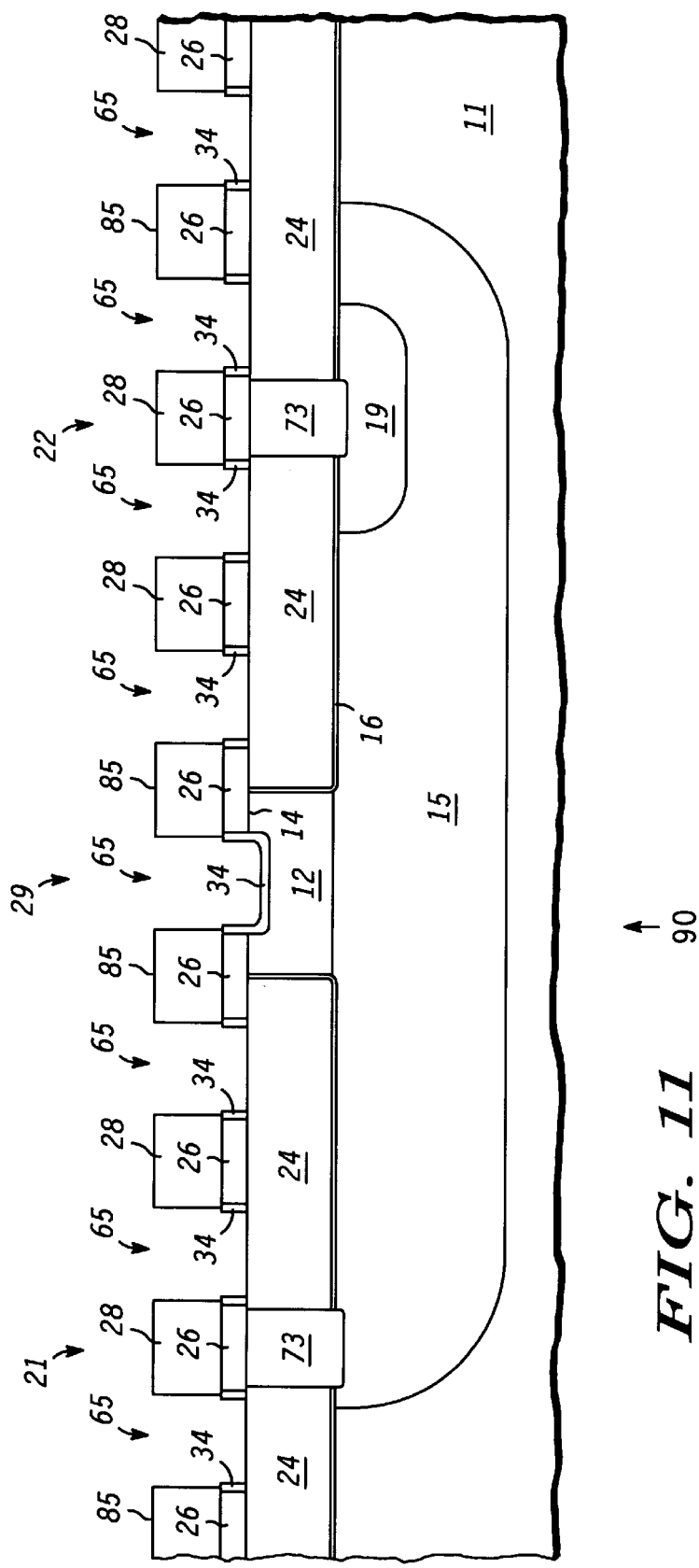

Beginning with FIG. 11, a method for forming interconnect structure 90 in conjunction with device 10 of the previous narration will be provided. This is done to avoid unnecessary repetition, but it should also be understood that interconnect structure 90 can be formed independently of device 10. Pedestal 12, buried interconnect region 19, first thermal oxide layer 16, plug regions 73, and first dielectric layer 24 are formed in a similar fashion as provided above for device 10. Second conductors 97 are formed in a slightly different manner than in the method described above. First polysilicon layer 26 is deposited onto substrate 11 followed by the deposition of second dielectric layer 28. Previously, first polysilicon layer 26 was patterned and etched before the formation of second dielectric layer 28.

Second dielectric layer 28 is then planarized using a CMP process to provide second planar surface 85. Following the planarization process, second dielectric layer 28 is then patterned using a photolithographic mask (not shown). A reactive ion etch is then used to remove portions of second dielectric layer 28 and first polysilicon layer 26 to form openings 65 as shown in FIG. 11. Openings 65 provide the physical and electrical isolation in first polysilicon layer 26 to define the regions of second conductor 97. Therefore, each of second conductors 97 shown in FIG. 10 is electrically isolated from each other and each can be used to transport a different electrical signal or voltage potential.

During the steps used to form openings 65, gate opening 29 is formed to expose a portion of pedestal 12. Note, no additional process steps are required to form gate opening 29. The photolithographic mask is then removed and the exposed portions of pedestal 12 and first polysilicon layer 26 are oxidized to form second thermal oxide layer 34. Since first polysilicon layer 26 is an electrically conductive layer, second thermal oxide layer 34 provides part of the necessary electrical isolation between first conductors 60 and second conductors 97. It is necessary to electrically isolate second conductors 97 from the subsequent structures formed in openings 65 as described below.

Figure 12:
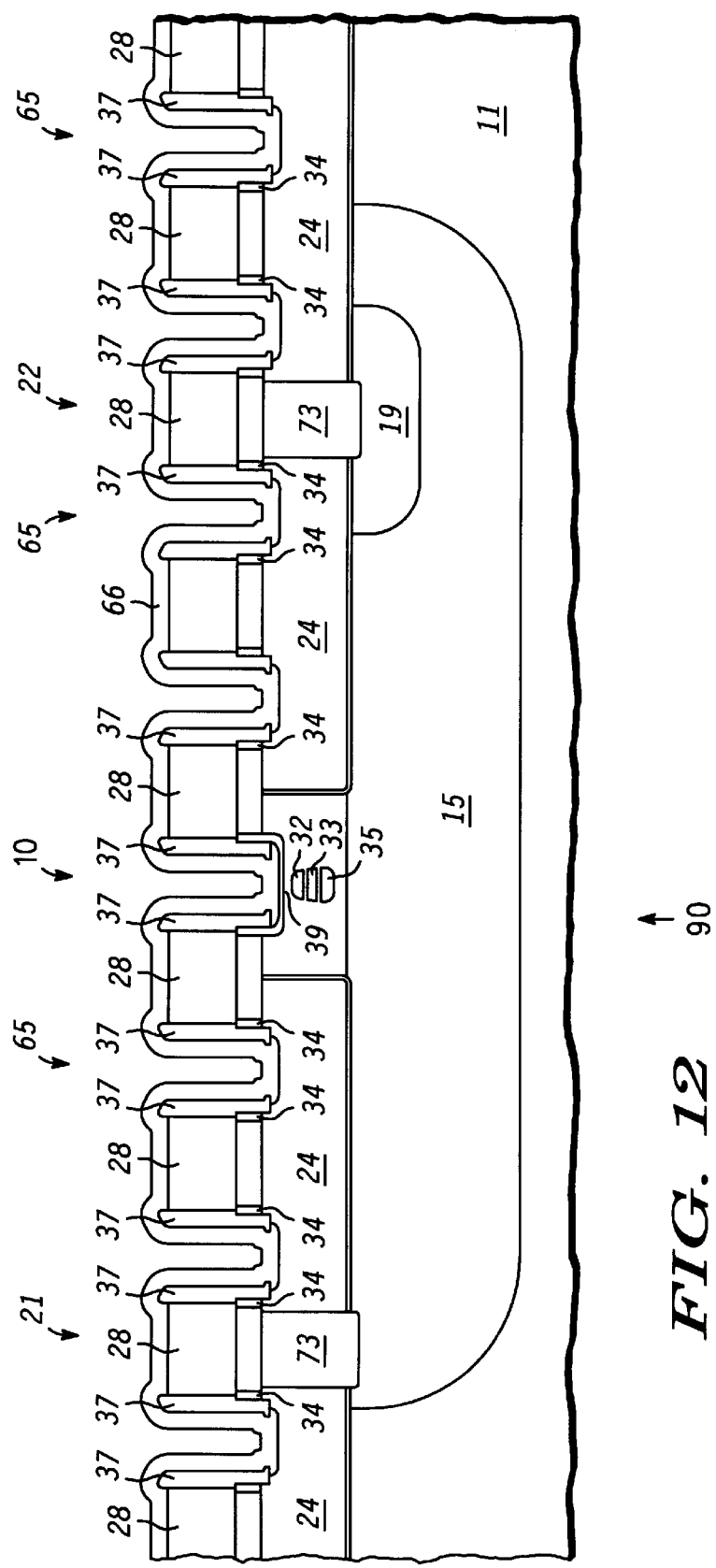

Referring now to FIG. 12, a description of the formation of first conductors 60 in openings 65 will be provided. A layer of silicon nitride (not shown) is deposited onto substrate 11 and into openings 65 and anisotropically etched to form first spacers 37. First spacers 37 will have a width that is approximately equal to the thickness of the silicon nitride layer from which first spacers 37 are formed. The process to form first spacers 37 is the same as the process described above in the formation of device 10. As required for the formation of device 10, a portion of second thermal oxide layer 34 on pedestal 12 is removed and gate dielectric layer 39 is grown on major surface 14 of pedestal 12. Next, a third polysilicon layer 66 is conformally deposited onto substrate 11 and onto gate dielectric layer 39. Third polysilicon layer 66 is about 300 angstroms to 1,000 angstroms thick and is formed for the following implantation steps used to form doped region 18 (see FIG. 1). Additionally, a screen oxide (not shown) is thermally grown onto third polysilicon layer 66 and is about 50 angstroms to 300 angstroms thick. A sequence of implantation steps, such as the ones provided above, can be used to form doping region 32, 33, 35.

A wet etch process is then used to remove the screen oxide layer and expose the underlying third polysilicon layer 66. It should be understood that the process steps used in the formation of gate dielectric layer 39 or doping regions 32, 33, and 35 are not a necessary requirement for the formation of interconnect structure 90. It is possible to use interconnect structure 90 for other device structures so that the processing steps particular to device 10 should be considered optional.

The method for forming interconnect structure 90 also provides a slightly different method of forming portions of device 10. As described earlier, doping regions 32, 33, and 35 are formed by implanting pedestal 12 through an aperture, the aperture being provided by spacers 36 made from polysilicon. In this alternate method, doping regions 32, 33, and 35 are formed by implanting pedestal 12 through an aperture provided by first spacers 37, third polysilicon layer 66, and the screen oxide layer.

Turning back to FIG. 10, the final processing steps to form interconnect structure 90 will be provided. After the screen oxide layer is removed, a conductive material is deposited onto third polysilicon layer 66 to provide the material used to form first conductor 60. For example, second polysilicon layer 38 can be deposited to fill openings 65. This step is already provided in the method to form device 10 as second polysilicon layer 38 was used to fill gate opening 29. After deposition, either a CMP or an anisotropic etch process is used to remove the portions of second polysilicon layer 38 on second planar surface 85. This step physically and electrically isolates portions of second polysilicon layer 38 to form first conductors 60. It should also be understood that openings 65 and gate opening 29 can be filled with a variety of conductive materials such as polysilicon, amorphous silicon, tungsten, cobalt, chromium, or the like.

After the etch process, each of first conductors 60 is electrically isolated from each other and is electrically isolated from second conductors 97. As shown in FIG. 10, second conductors 97 can be used to electrically couple to plug regions 73 in the formation of plug contacts 21 and 22. It should also be understood that first conductors 60 and second conductors 97 can be used to carry electrical signals throughout an integrated circuit (not shown) and do not necessarily have to be coupled to portions of device 10 such as plug contacts 21 and 22 or gate structure 20.

To further enhance the electrical properties of first conductors 60 and second conductors 97, conductive layers 96 and 95 may be optionally formed on first conductors 60 and second conductors 97 respectively. First the portions of second dielectric layer 28 on second conductors 97 are removed using a conventional wet etch. Conductive layers 95 and 96 are preferably formed from a silicidation process to form a metal compound comprising titanium, cobalt, or similar material. First spacers 37 provide an additional benefit in that they can be used in the silicidation process to electrically isolate first conductors 60 and second conductors 97. First spacers 37 are preferably made from silicon nitride and thus the metal compound used to form conductive layers 95 and 96 will not form along the surface of first spacers 37.

By now it should be appreciated that the present invention provides a graded-channel semiconductor device and an interconnect structure. The present invention also provides a method for forming both structures together or forming each structure separately. The graded-channel semiconductor device of the present invention offers many advantages over conventional semiconductor devices such as improved punch-through resistance, improved current densities at lower operating voltages, and improved manufacturability. The interconnect structure of the present invention offers advantages such as an improved pitch width, which in turn increase the density of interconnect layers in the structure. These advantages provide for a device that has improved functionality with a lower manufacturing cost.

We claim:

1. A semiconductor device comprising:
   a body of semiconductor material of a first conductivity type and having a surface;
   a pedestal on the surface of the body of semiconductor material, the pedestal having a major surface and sidewalls that are substantially orthogonal to the body of semiconductor material;
   a first doped region of a second conductivity type formed in the pedestal and extending from the major surface;
   a second doped region of the second conductivity type formed in the pedestal and extending from the major surface;
   a channel region between the first doped region and the second doped region;
   a third doped region of the first conductivity type formed in the pedestal, wherein the third doped region is vertically spaced apart from the major surface, and wherein the third doped region is vertically and laterally spaced apart from the first doped region and the second doped region; and
   a gate structure overlying the major surface and overlying the channel region.

2. The semiconductor device of claim 1 wherein the third doped region has a dopant concentration that is at least an order of magnitude higher than that of the body of semiconductor material.

3. The semiconductor device of claim 1 wherein the third doped region is spaced a distance of at least 125 angstroms from the major surface.

4. The semiconductor device of claim 1 wherein the third doped region is substantially centered between the first doped region and the second doped region.

5. The semiconductor device of claim 1 wherein the first conductivity type is p-type and the second conductivity type is n-type.

6. The semiconductor device of claim 1 wherein the first doped region and the second doped region are elevated above the surface of the body of semiconductor material.

7. The semiconductor device of claim 1 wherein the pedestal has sides and the semiconductor device further comprises a dielectric layer formed along the sides of the pedestal.

8. The semiconductor device of claim 1 wherein the gate structure further includes a thermal oxide layer and spacers.

9. The semiconductor device of claim 8 wherein the gate structure further includes a conductive material formed between the spacers.

10. The semiconductor device of claim 9 wherein the conductive material is a material selected from the group consisting of polysilicon, amorphous silicon, tungsten, cobalt, or titanium.

11. A semiconductor device comprising:
    a semiconductor substrate of a first conductivity type having a surface and a first dopant concentration;
    a pedestal on the surface of the semiconductor substrate, the pedestal having a major surface and sides, wherein the sides of the pedestal are substantially orthogonal to the surface of the semiconductor substrate;

a dielectric layer formed along the sides of the pedestal;

a source region of a second conductivity type formed in the pedestal and extending from the major surface;

a drain region of the second conductivity type formed in the pedestal and extending from the major surface, wherein the source region and the drain region are above the surface of the semiconductor substrate;

a channel region between the source region and the channel region;

a doped region of the first conductivity type formed in the channel region, wherein the doped region does not contact the source region, the drain region, and the major surface, and wherein the doped region has a second dopant concentration higher than the first dopant concentration and the doped region is spaced a distance of at least 125 angstroms from the major surface;

a gate structure formed contiguous with the channel region, wherein the gate structure comprises spacers and a conductive material between the spacers, the gate structure overlaps a portion of the source region and a portion of the drain region;

a first electrode coupled to the source region; and a second electrode coupled to the drain region.

12. The semiconductor device of claim 11 wherein the first dopant concentration is less than $2.0 \times 10^{16}$ atoms/cm$^3$.

13. The semiconductor device of claim 11 wherein the second dopant concentration is at least about $3.0 \times 10^{17}$ atoms/cm$^3$.

14. The semiconductor device of claim 11 wherein the first conductivity type is p-type and the second conductivity type is n-type.

15. The semiconductor device of claim 11 wherein the conductive material is a material selected from the group consisting of polysilicon, amorphous silicon, tungsten, molybdenum, cobalt, or titanium.

16. The semiconductor device of claim 11 further comprising an additional semiconductor device formed in the pedestal.

17. The semiconductor device of claim 16 wherein the semiconductor device and the additional semiconductor device are electrically coupled together.

* * * * *